(12) United States Patent
Yang et al.

(10) Patent No.: US 10,832,981 B2
(45) Date of Patent: Nov. 10, 2020

(54) DISPLAY DEVICE

(71) Applicant: Samsung Display Co., Ltd., Yongin-si (KR)

(72) Inventors: Sung-Jin Yang, Cheonan-si (KR); Sung Hee Kim, Yongin-si (KR); In Ho Kim, Asan-si (KR); Hyun Sik Park, Cheonan-si (KR); Gyeong Nam Bang, Seoul (KR); Chun Gi You, Asan-si (KR); Chang Ho Lee, Busan (KR); Hye Yun Han, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 78 days.

(21) Appl. No.: 16/374,762

(22) Filed: Apr. 4, 2019

(65) Prior Publication Data

US 2020/0126878 A1    Apr. 23, 2020

(30) Foreign Application Priority Data

Oct. 18, 2018   (KR) .................. 10-2018-0124394

(51) Int. Cl.
*H01L 23/32*    (2006.01)
*H01L 23/053*    (2006.01)
*G09G 3/3225*    (2016.01)
*H01L 23/31*    (2006.01)
*H01L 23/00*    (2006.01)

(52) U.S. Cl.
CPC ......... *H01L 23/053* (2013.01); *G09G 3/3225* (2013.01); *H01L 23/3192* (2013.01); *H01L 23/564* (2013.01)

(58) Field of Classification Search
CPC ............ H01L 27/3258; H01L 27/3223; H01L 27/3276; H01L 51/0097; H01L 51/5253; H01L 51/5246; H01L 51/5234; H01L 51/5284; H01L 51/524; H01L 51/56
See application file for complete search history.

(56) References Cited

U.S. PATENT DOCUMENTS

| 2015/0060778 A1* | 3/2015 | Kim ................. H01L 27/3258 257/40 |
| 2015/0194625 A1* | 7/2015 | Kim ................. H01L 51/5246 257/40 |
| 2017/0155093 A1 | 6/2017 | Jo |
| 2018/0149872 A1 | 5/2018 | Choi et al. |

FOREIGN PATENT DOCUMENTS

| KR | 10-1747268 | 6/2017 |
| KR | 10-2018-0003967 | 1/2018 |
| KR | 10-2018-0015697 | 2/2018 |
| KR | 10-2018-0061467 | 6/2018 |
| KR | 10-2018-0077752 | 7/2018 |

\* cited by examiner

*Primary Examiner* — Cuong Q Nguyen
(74) *Attorney, Agent, or Firm* — H.C. Park & Associates, PLC

(57) ABSTRACT

A display device including: a first substrate including a display area and a peripheral area; a display part disposed on the first substrate and to include a plurality of pixels; a second substrate disposed on the display part; and an inorganic layer disposed on the second substrate. The inorganic layer may include an opening, and the opening overlaps the display area and the peripheral area.

22 Claims, 20 Drawing Sheets

DISPLAY DEVICE

CROSS-REFERENCE TO RELATED APPLICATION

This application claims priority from and the benefit of Korean Patent Application No. 10-2018-0124394, filed on Oct. 18, 2018, which is hereby incorporated by reference for all purposes as if fully set forth herein.

BACKGROUND

Field

Exemplary embodiments of the invention relate generally to a display device.

DISCUSSION OF THE BACKGROUND

Among display devices, a head mounted display (HMD) is a device mounted on a user's head to display an image to a user. The head mounted display has recently attracted attention as a visualization device that provides virtual reality (VR) or augmented reality (AR).

The HMD includes a display panel for displaying an image, and an optical part disposed between the display panel and the user. The optical part enlarges an image displayed on the display panel such that the user may view the image.

When the image of the display panel is enlarged by the optical part, a screen door effect (SDE), in which the image is viewed as if viewing through a net or a non-display area is displayed in black occurs, which results in degraded display quality and readability of letters.

The above information disclosed in this Background section is only for enhancement of understanding of the background of the invention, and therefore it may contain information that does not form the prior art that is already known in this country to a person of ordinary skill in the art.

The above information disclosed in this Background section is only for understanding of the background of the inventive concepts, and, therefore, it may contain information that does not constitute prior art.

SUMMARY

Exemplary embodiments of the present invention provide a display device having improved transmittance and display quality.

Additional features of the inventive concepts will be set forth in the description which follows, and in part will be apparent from the description, or may be learned by practice of the inventive concepts.

An exemplary embodiment provides a display device including: a first substrate having a display area and a peripheral area; a display part disposed on the first substrate and including a plurality of pixels; a second substrate disposed on the display part; and an inorganic layer disposed on the second substrate. The inorganic layer may include an opening, and the opening overlaps the display area and the peripheral area.

The opening may include a first opening overlapping the display area and a second opening overlapping the peripheral area.

A diameter of the first opening may be substantially the same as that of the second opening.

The diameter of the first opening may be greater than that of the second opening.

The diameter of the first opening may be less than that of the second opening.

A distance between centers of a plurality of adjacent first openings may define a first pitch, and a distance between centers of a plurality of adjacent second openings may define a second pitch.

The first pitch may be substantially the same as the second pitch.

The first pitch may be larger than the second pitch.

The first pitch may be smaller than the second pitch.

A virtual triangle may be formed by connecting centers of three adjacent openings.

The virtual triangle may be an equilateral triangle.

A virtual quadrangle may be formed by connecting centers of four adjacent openings.

The virtual quadrangle may be a square.

An imaginary second line crossing the centers of the plurality of openings may be inclined with respect to an imaginary first line substantially parallel to one edge of the first substrate.

An angle between the imaginary first line and the imaginary second line may be about 3 degrees to about 30 degrees.

Another exemplary embodiment provides a display device including: a housing; a display panel mounted on the housing; and an optical part overlapping the display panel. The display panel may include a first substrate including a display area and a peripheral area, a display part disposed on the first substrate and include a plurality of pixels, and an inorganic layer disposed on the display part, and the inorganic layer may include a plurality of openings overlapping the display area and the peripheral area, and the peripheral area overlaps an edge of the first substrate.

The display device may further include a second substrate or an encapsulation layer disposed between the display part and the inorganic layer.

A diameter of one opening may be 55% to 85% of a distance between centers of two adjacent openings.

The encapsulation layer may include a first encapsulation inorganic layer, a second encapsulation inorganic layer overlapping the first encapsulation inorganic layer, and an encapsulation organic film disposed between the first encapsulation inorganic layer and the second encapsulation inorganic layer.

The inorganic layer may be disposed on the second encapsulation inorganic layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
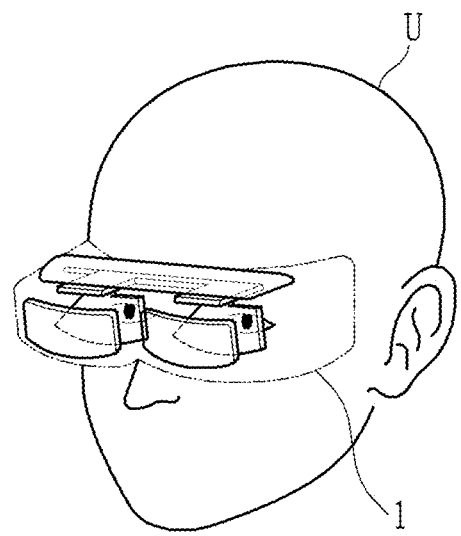
FIG. 1A and FIG. 1B illustrate schematic diagrams of a display device according to an exemplary embodiment.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
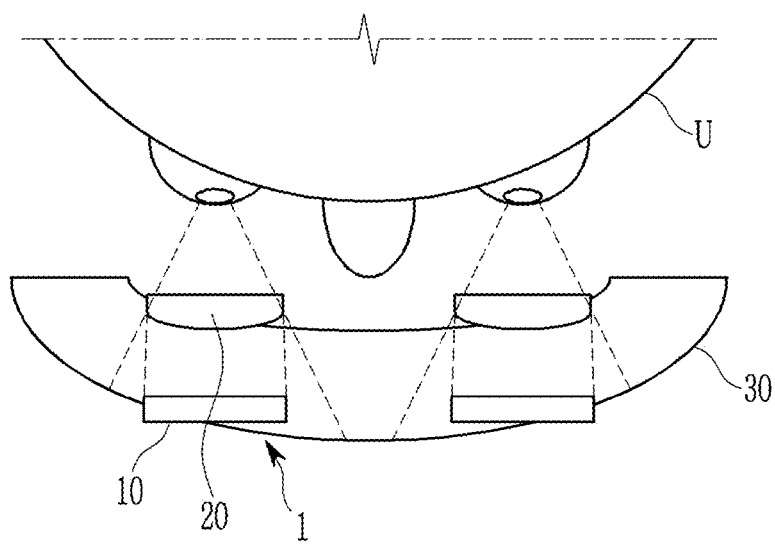

Hereinafter, a display device according to an exemplary embodiment will be described with reference to FIG. 1A and FIG. 1B. FIG. 1A and FIG. 1B illustrate schematic diagrams of a display device according to an exemplary embodiment. For better comprehension and ease of description, a state in which a display device is mounted on the user is shown.

As shown in FIG. 1A, a display device 1 according to an exemplary embodiment is mounted on a head of a user U, and displays an image to the eyes (left and right eyes) of the user U. Referring to FIG. 1B, the display device 1 includes a display panel 10, an optical part 20 overlapping the display panel 10, and a housing 30 on which the display panel 10 and the optical part 20 are mounted.

The display panel 10 is mounted on the housing 30 and displays an image. The display panel 10 may include a plurality of display panels corresponding to the left and right eyes of the user U. In the present specification, the display panel 10 corresponding to each of the left and right eyes is shown as being separated, but the inventive concept is not limited thereto, and the display panels corresponding to the left and right eyes may be connected to each other to form an integral body.

The display panel 10 may be a light emitting diode display panel, but the inventive concept is not limited thereto, and the display panel 10 may be a liquid crystal display panel.

The optical part 20 overlaps the display panel 10, and is disposed between the user U and the display panel 10. The optical part 20 refracts an image displayed on the display panel 10 in an eye direction of the user U. The display device 1 may include a plurality of optical parts 20 corresponding to the left eye and the right eye, respectively.

For example, the optical part 20 may include a convex lens that is convex toward the display panel 10. The optical part 20 may include a concave lens for correcting distortion caused by the convex lens. In this case, the concave lens may be an aspherical lens, but the inventive concept is not limited thereto.

The housing 30 may be made in any shape as long as it can be mounted on the head of the user U in a state in which the display panel 10 and the optical part 20 are mounted. The housing 30 may have various shapes, for example, an eyeglass shape, a helmet shape, or the like.

Figure 2:
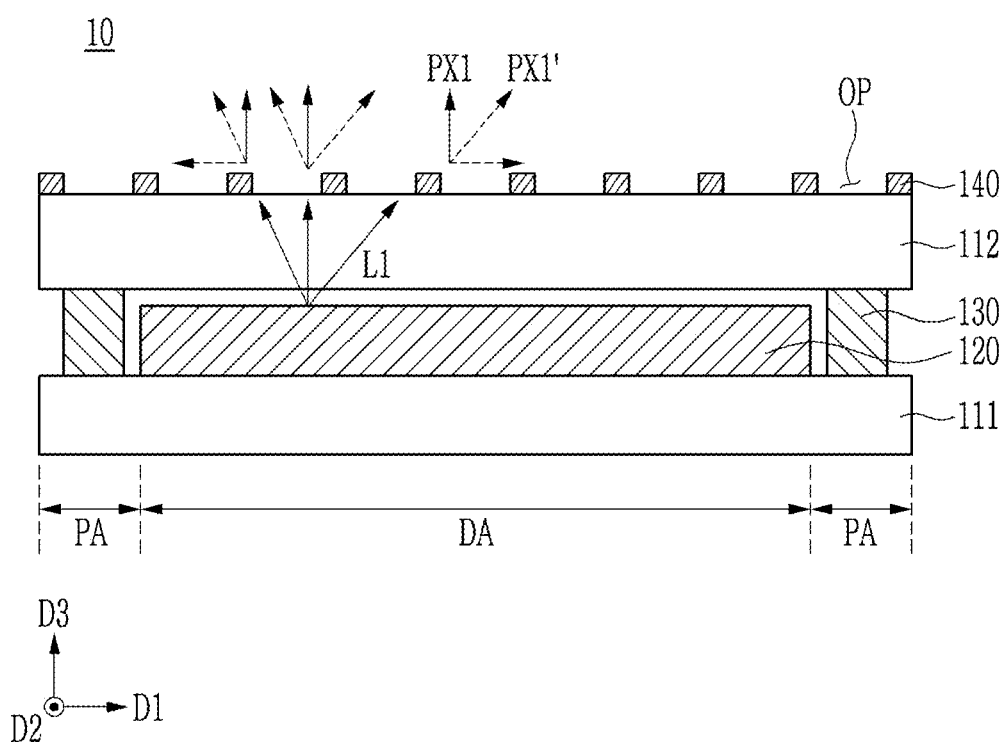
FIG. 2 illustrates a schematic cross-sectional view of a display panel according to an exemplary embodiment.

Hereinafter, a structure of a display panel according to an exemplary embodiment will be described with reference to FIG. 2 to FIG. 4B. FIG. 2 illustrates a schematic cross-sectional view of a display panel according to an exemplary embodiment, FIG. 3 illustrates a schematic plan view of a display panel according to an exemplary embodiment, FIG. 4A illustrates a schematic view of a pattern shape viewed by a user in a state in which an inorganic layer is removed from a display panel, and FIG. 4B illustrates a schematic view of a pattern shape viewed by a user in a state in which an inorganic layer is included.

Figure 3:
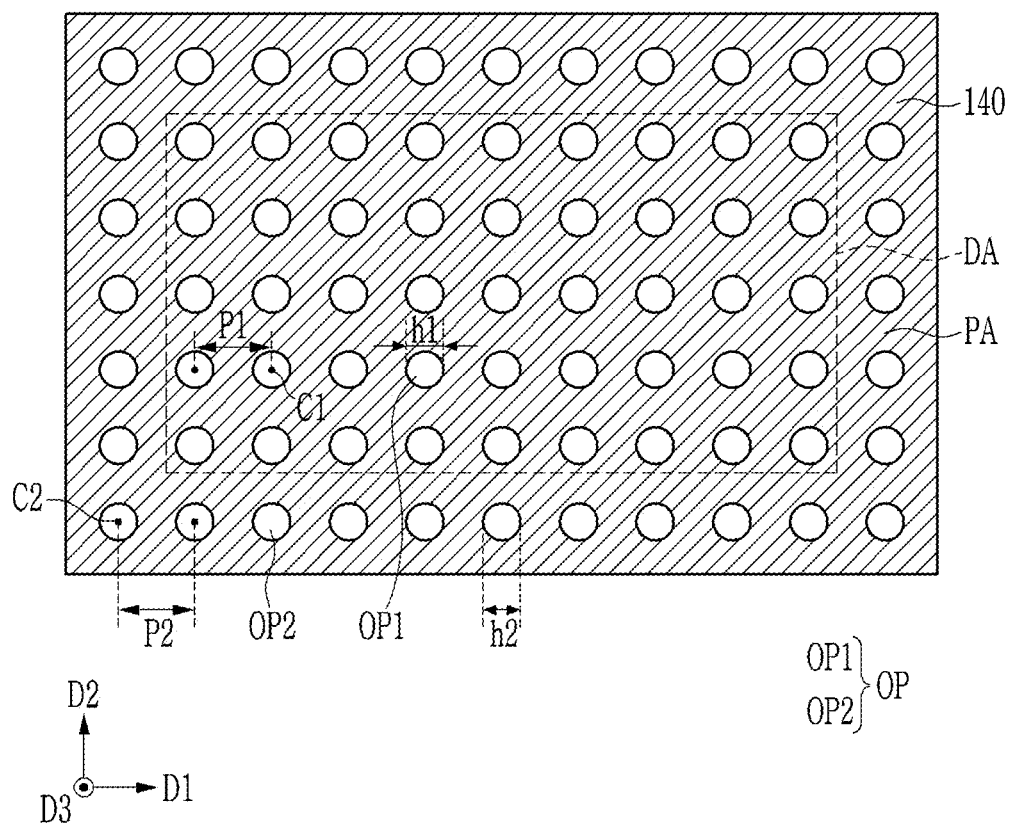
FIG. 3 illustrates a schematic plan view of a display panel according to an exemplary embodiment.
Figure 4A:
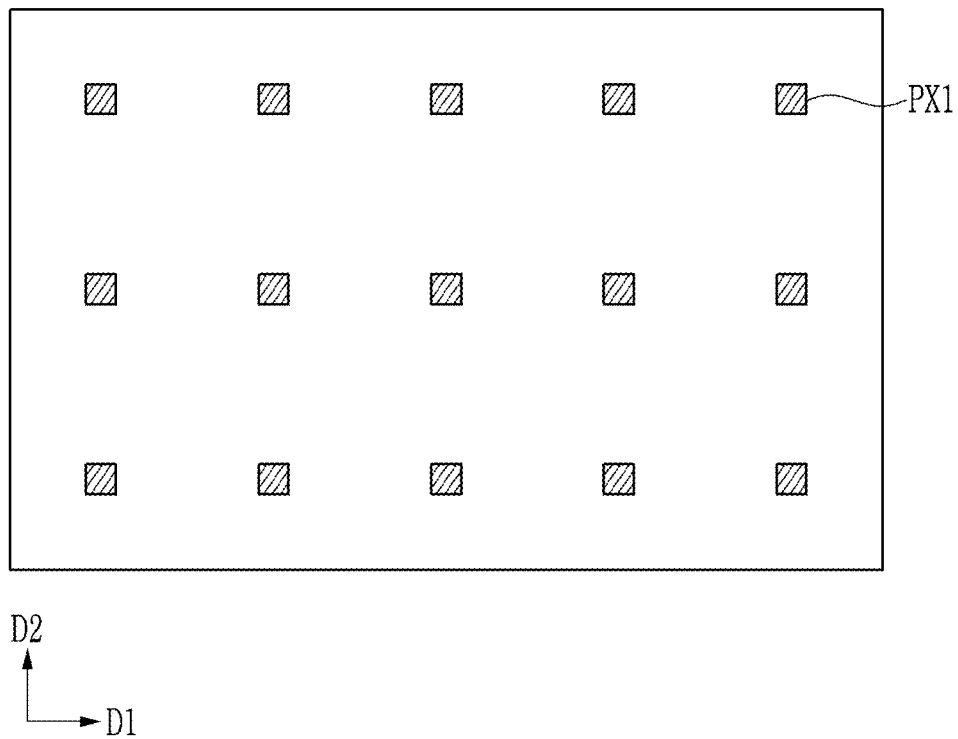
FIG. 4A illustrates a schematic view of a shape viewed by a user in a state in which an inorganic layer is removed.
Figure 4B:
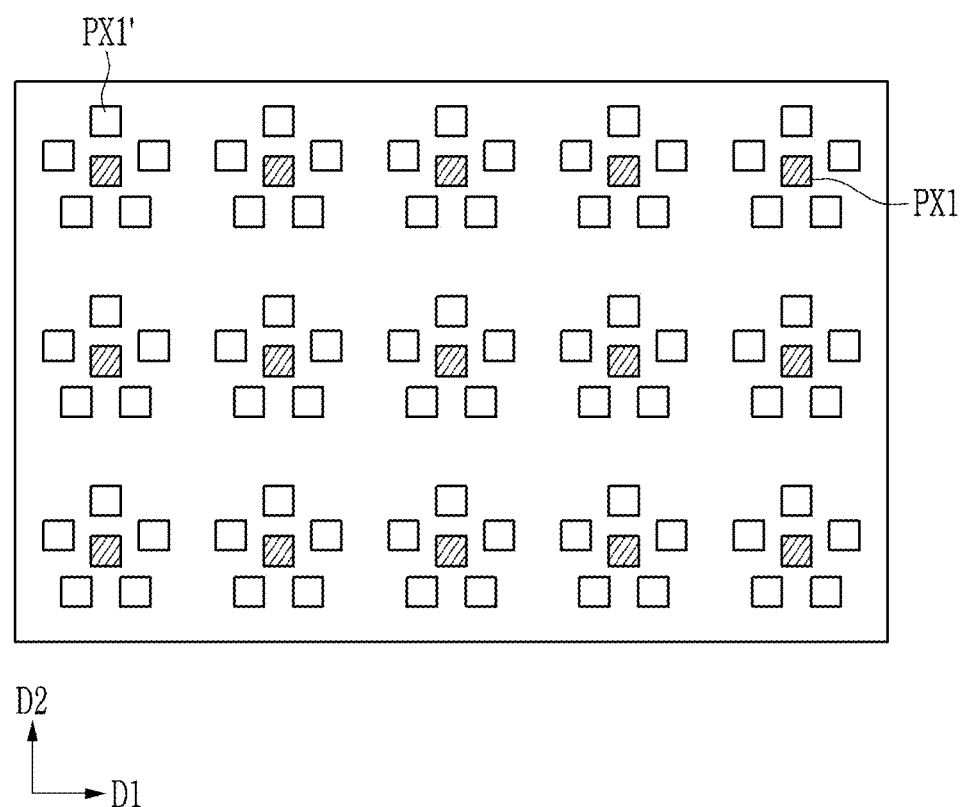
FIG. 4B illustrates a schematic view of a shape viewed by a user in a state in which an inorganic layer is included.

Referring to FIG. 2 and FIG. 3, the display panel 10 according to an exemplary embodiment includes a display part 120 disposed on a first substrate 111 and including a plurality of pixels, a second substrate 112 covering the display part 120, a sealing part 130 coupling the first substrate 111 and the second substrate 112, and an inorganic layer 140 disposed on the second substrate 112.

The first substrate 111 according to this exemplary embodiment includes a display area DA overlapping the plurality of pixels, and a peripheral area PA surrounding the display area DA. The peripheral area PA may overlap an edge of the first substrate 111, and may be disposed outside the display area DA.

The first substrate 111 may be an insulating substrate including glass, quartz, ceramics, plastic, or the like, or a metallic substrate including stainless steel or the like. In some exemplary embodiments, the first substrate 111 may be flat or flexible.

The display part 120 may include a plurality of pixels. One pixel may include a thin film transistor and a light emitting diode connected to the thin film transistor. The thin film transistor and the light emitting diode connected to the thin film transistor will be described later with reference to FIG. 14. The display part 120 is not limited to including the thin film transistor and the light emitting diode, but may include the thin film transistor and a liquid crystal layer.

The second substrate 112 may be an encapsulating substrate disposed on the display part 120. The second substrate 112 may be an insulating substrate including glass, quartz, ceramics, plastic, or the like, or a metallic substrate including stainless steel or the like. The second substrate 112 may be a transparent resin substrate or a flat substrate to be flexible or bendable.

The inorganic layer 140 may be disposed on the second substrate 112. The inorganic layer 140 may be disposed outside the second substrate 112. The inorganic layer 140 may be disposed on one surface of the second substrate 112, and another surface of the second substrate 112 faces the display part 120. The display part 120, the second substrate 112, and the inorganic layer 140 may be sequentially stacked along a direction D3 with respect to the first substrate 111.

The inorganic layer 140 may overlap the first substrate 111 and the second substrate 112. Particularly, the inorganic layer 140 may overlap the display area DA and the peripheral area PA.

The inorganic layer 140 may include any inorganic material, and for example, may include a silicon nitride, a silicon oxide, and the like.

The inorganic layer 140 may include a plurality of openings OP. The opening OP may completely penetrate the inorganic layer 140. The opening OP may refer to a region in which the inorganic layer 140 is removed along a thickness direction (which corresponding the direction D3) of the inorganic layer 140.

The plurality of openings OP included in the inorganic layer 140 may overlap not only the display area DA but also the peripheral area PA. An area of a plane occupied by the plurality of openings OP may be about 60% to about 70% of a sum of areas of the display area DA and the peripheral area PA. In the present specification, the plane means a plane formed in the direction D1 and the direction D2.

A planar shape of the opening OP may be, for example, circular. However, the planar shape of the opening OP is not limited thereto, and the opening OP may have various shapes, such as a triangle, a rectangle, a polygon, and an ellipse.

The opening OP may include a first opening OP1 overlapping the display area DA and a second opening OP2 overlapping the peripheral area PA. Although not shown, at least one of the first opening OP1 and the second opening OP2 may be disposed at a boundary between the display area DA and the peripheral area PA. The first opening OP1 disposed at the boundary between the display area DA and the peripheral area PA may overlap both the display area PA and the peripheral area PA. The second opening OP2 disposed at the boundary between the display area DA and the peripheral area PA may overlap both the display area DA and the peripheral area PA.

In the present specification, a distance between respective centers of two adjacent openings OP is referred to as a "pitch". Referring to FIG. 3, a distance between respective centers C1 of two adjacent first openings OP1 disposed in the display area DA is a first pitch P1. A distance between respective centers C2 of two adjacent second openings OP2 disposed in the peripheral area PA is a second pitch P2.

The first pitch P1 and the second pitch P2 according to an exemplary embodiment may be substantially the same. The distance between the centers C1 of the plurality of first openings OP1 overlapping the display area DA may be substantially the same as that between the centers C2 of the plurality of second openings OP2 overlapping the peripheral area PA. Intervals between the plurality of openings OP1 and OP2 may be substantially the same in both of the display area DA and the peripheral area PA. The interval or distance between the plurality of openings OP1 and OP2 may refer to a minimum linear distance between the adjacent openings OP1 and OP2.

Each of the first pitch P1 and the second pitch P2 may be about 5 µm to about 10 µm. When each of the first pitch P1 and the second pitch P2 is less than about 5 µm or greater than about 10 µm, the light passing through the inorganic layer 140 may not be effectively diffracted or scattered.

A diameter h1 of the first opening OP1 and a diameter h2 of the second opening OP2 may be substantially the same. As shown in FIG. 3, the planar sizes of the first opening OP1 overlapping the display area DA and the second opening OP2 overlapping the peripheral area PA may be substantially the same. The plurality of openings OP1 and OP2 overlapping the display area DA and the peripheral area PA may have substantially the same size.

The diameter h1 of the first opening OP1 may be from about 55% to about 85% of the first pitch P1, for example, from about 65% to about 75% thereof. The diameter h2 of the second opening OP2 may be from about 55% to about 85% of the second pitch P2, for example, from about 65% to about 75% thereof. The first opening OP1 and the second opening OP2 may have substantially the same diameter within the above-described range. When the diameters of the first and second openings OP1 and OP2 are less than 55% or greater than 85% of the pitch, the light emitted from the display part 120 may not be effectively diffracted or scattered.

When the inorganic layer 140 is disposed on the second substrate 112, as in the present exemplary embodiment, the light L1 emitted from the display part 120 may be diffracted, scattered, or refracted. This will be described with reference to FIG. 2, FIG. 4A, and FIG. 4B.

FIG. 4A shows a case in which a separate inorganic layer is not disposed on the second substrate 112. As shown in FIG. 4A, one pixel included in the display part 120 may be viewed by the user as one pixel PX1 through the emission of light.

However, in the case of including the inorganic layer 140 disposed on the second substrate 112, the light L1 emitted from the display part 120 may be transmitted to the user as it is, and may be diffracted, scattered, or refracted as indicated by the dotted line in FIG. 2. According to diffraction, scattering, or refraction of the light emitted from the display part 120, a plurality of virtual pixels PX1' may be viewed by the user based on one pixel PX1 as shown in FIG. 4B. The plurality of virtual pixels PX1' may have the same effect as that of one pixel PX1. According to this, it is possible to provide an image with a higher resolution than the actual resolution of the display part 120.

Since the display device according to this exemplary embodiment includes the optical part 20, the image provided from the display part 120 may be enlarged and viewed by the user. In this case, a screen door effect (SDE), in which a net-like shape is viewed, or a non-pixel area between pixel areas is viewed as black, may occur. According to this exemplary embodiment, when the plurality of virtual pixels PX1' are viewed as one pixel PX1 that is replicated, the screen door effect in which the non-pixel area or the like is viewed may be reduced.

The inorganic layer 140 according to this exemplary embodiment may include a large number of openings OP in order to realize the effect in which the pixel is replicated as described above. The inorganic layer 140 may be manufactured through a manufacturing process in which an inorganic material is stacked and an opening is formed. In this case, a load may be generated in the process of forming a large number of openings OP. When the process of forming the openings OP is repeated a plurality of times, the plurality of openings OP may not be uniformly formed, thereby resulting in sizes or pitches of the openings OP overlapping the display area being non-uniform. When a plurality of openings OP having a non-uniform shape or arrangement is included, transmittance of the display panel may be reduced.

The inorganic layer 140 according to this exemplary embodiment may be provided with the openings OP overlapping both the display area DA and the peripheral area PA. For this purpose, when a process of forming openings in the entire surface of the substrate is performed, uniformity of formation of the openings compared to a process of forming the openings in a portion of the substrate may be improved. The plurality of openings OP overlapping the display area DA and the peripheral area PA may be formed to have a uniform shape and a uniform pitch.

In addition, shapes or pitches of some of the openings OP may be non-uniform due to a load in the manufacturing process. However, in this case, the openings OP disposed at the outer periphery of the plurality of openings OP can be formed in a non-uniform manner due to the load of the manufacturing process. The shape or pitch of the opening OP overlapping the peripheral area PA other than the display area DA may be changed. Display quality of images displayed in the display area DA may not be greatly affected. The display panel according to this exemplary embodiment may improve the display quality.

Hereinafter, a display panel according to other exemplary embodiments will be described with reference to FIG. 5 to FIG. 12. FIGS. 5 to 12 illustrate a schematic plan view of a display panel according to exemplary embodiments. Hereinafter, only components different from those of the above-described exemplary embodiment will be described, so a detailed description of the same components will be omitted.

Figure 5:
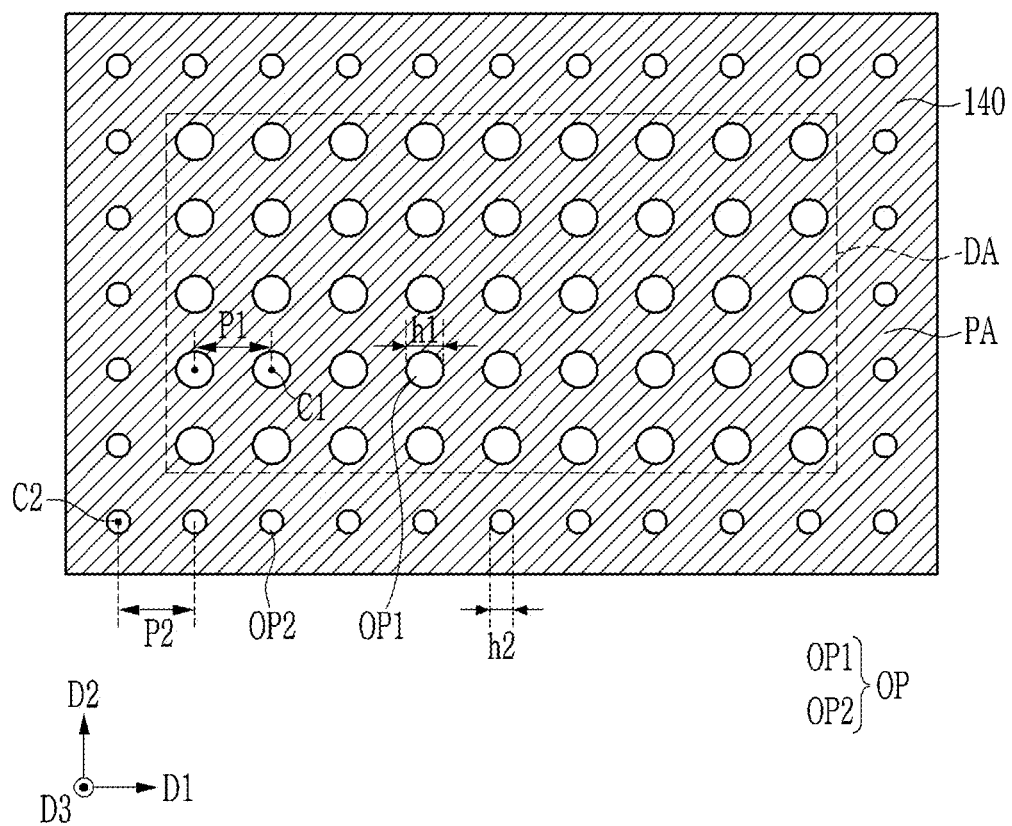
FIGS. 5, 6, 7, 8, 9, 10, 11, and 12 illustrate a schematic plan view of a display panel according to exemplary embodiments.

First, referring to FIG. 5, the inorganic layer 140 may overlap the display area DA and the peripheral area PA.

The inorganic layer 140 may include a plurality of openings OP. The plurality of openings OP included in the inorganic layer 140 may overlap not only the display area DA but also the peripheral area PA. The area of the plane occupied by the plurality of openings OP may be about 60% to about 70% of the sum of the areas of the display area DA and the peripheral area PA.

The opening OP may include a first opening OP1 overlapping the display area DA and a second opening OP2 overlapping the peripheral area PA. Although not shown, at least one of the first opening OP1 and the second opening OP2 may be disposed at a boundary between the display area DA and the peripheral area PA.

A distance between respective centers C1 of two adjacent first openings OP1 disposed in the display area DA is a first pitch P1. A distance between respective centers C2 of two adjacent second openings OP2 disposed in the peripheral area PA is a second pitch P2.

The first pitch P1 and the second pitch P2 according to an exemplary embodiment may be substantially the same. The straight-line distance between the centers C1 of the plurality of first openings OP1 overlapping the display area DA may be substantially the same as that between the centers C2 of the plurality of second openings OP2 overlapping the peripheral area PA. Intervals between centers of the plurality of openings OP1 and OP2 may be substantially the same in all of the display area DA and the peripheral area PA.

Each of the first pitch P1 and the second pitch P2 may be about 5 µm to about 10 µm. When the first pitch P1 and the second pitch P2 are less than about 5 µm or greater than about 10 µm, the light passing through the inorganic layer 140 may not be effectively diffracted, scattered, or refracted.

The diameter h1 of the first opening OP1 may be greater than the diameter h2 of the second opening OP2. As shown in FIG. 5, the planar size of the first opening OP1 overlapping the display area DA may be greater than the planar size of the second opening OP2 overlapping the peripheral area PA. The planar size of the second opening OP2 may be smaller than that of the first opening OP1.

The diameter h1 of the first opening OP1 may be about 55% to about 85% of the first pitch P1. The diameter h2 of the second opening OP2 may be about 55% to about 85% of the second pitch P2.

According to this exemplary embodiment, i) each of the first opening OP1 and the second opening OP2 has a diameter corresponding to about 55% to 85% of each of the first pitch P1 and the second pitch P2, and ii) the diameter h1 of the first opening OP1 may be greater than the diameter h2 of the second opening OP2.

Figure 6:
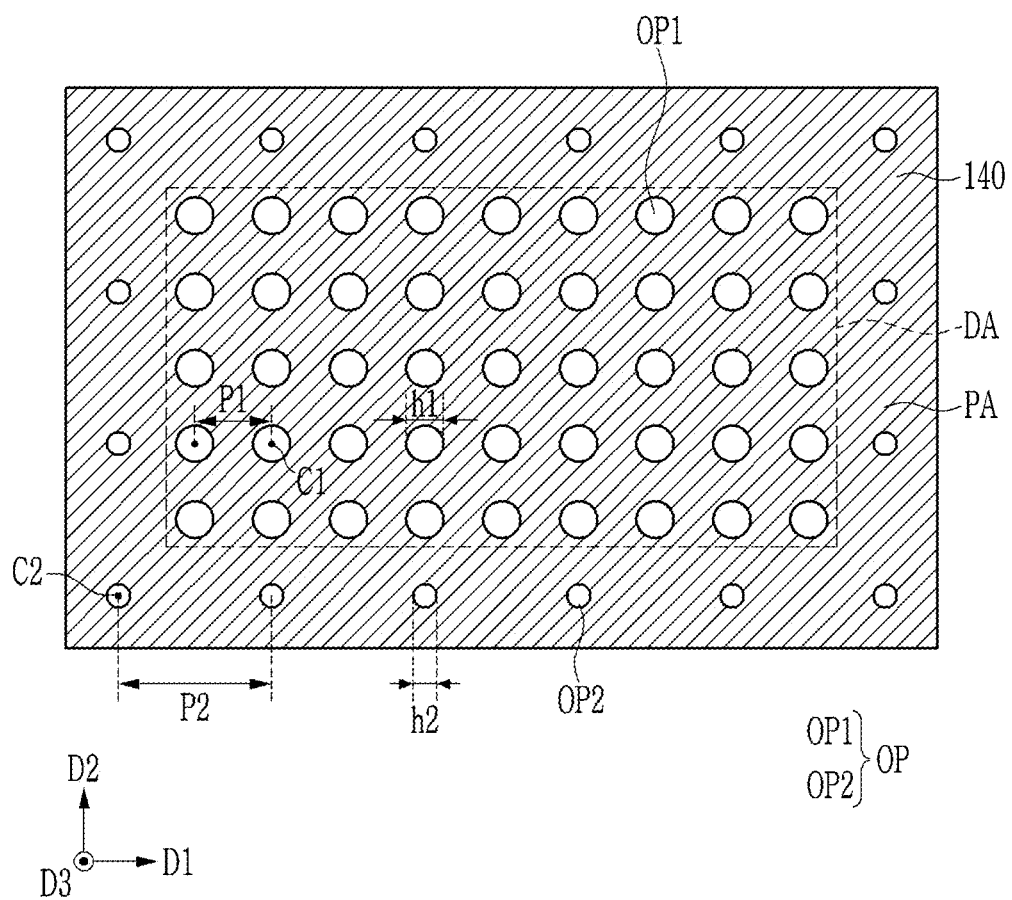

Referring to FIG. 6, the inorganic layer 140 may overlap the display area DA and the peripheral area PA.

The inorganic layer 140 may include a plurality of openings OP. The plurality of openings OP included in the inorganic layer 140 may overlap not only the display area DA but also the peripheral area PA. The area of the plane occupied by the plurality of openings OP may be about 60% to about 70% of the sum of the areas of the display area DA and the peripheral area PA.

The opening OP may include a first opening OP1 overlapping the display area DA and a second opening OP2 overlapping the peripheral area PA. Although not shown, at least one of the first opening OP1 and the second opening OP2 may be disposed at a boundary between the display area DA and the peripheral area PA.

In this exemplary embodiment, a distance between respective centers C1 of two adjacent first openings OP1 disposed in the display area DA is the first pitch P1. A distance between respective centers C2 of two adjacent second openings OP2 disposed in the peripheral area PA is the second pitch P2.

In some exemplary embodiments, the first pitch P1 and the second pitch P2 may be different. The distance between the centers C1 of the first openings OP1 and the distance of the centers C2 of the second openings OP2 may be different.

In some exemplary embodiments, the first pitch P1 may be smaller than the second pitch P2. The straight-line distance between the centers C1 of the plurality of first openings OP1 overlapping the display area DA may be smaller than that between the centers C2 of the plurality of second openings OP2 overlapping the peripheral area PA.

Each of the first pitch P1 and the second pitch P2 may be about 5 µm to about 10 µm. When the first pitch P1 and the second pitch P2 are less than about 5 µm or greater than about 10 µm, the light passing through the inorganic layer 140 may not be effectively diffracted, scattered, or refracted. While the first pitch P1 and the second pitch P2 may satisfy the above-mentioned numerical range, the second pitch P2 may be larger than the first pitch P1.

The diameter h1 of the first opening OP1 may be greater than the diameter h2 of the second opening OP2. As shown in FIG. 6, the planar size of the first opening OP1 overlapping the display area DA may be larger than the planar size of the second opening OP2 overlapping the peripheral area PA. The planar size of the second opening OP2 may be smaller than that of the first opening OP1.

The diameter h1 of the first opening OP1 may be about 55% to about 85% of the first pitch P1. The diameter h2 of the second opening OP2 may be about 55% to about 85% of the second pitch P2.

According to this exemplary embodiment, each of the first opening OP1 and the second opening OP2 has a diameter corresponding to about 55% to 85% of each of the first pitch P1 and the second pitch P2, and the diameter h1 of the first opening OP1 may be greater than the diameter h2 of the second opening OP2.

Figure 7:
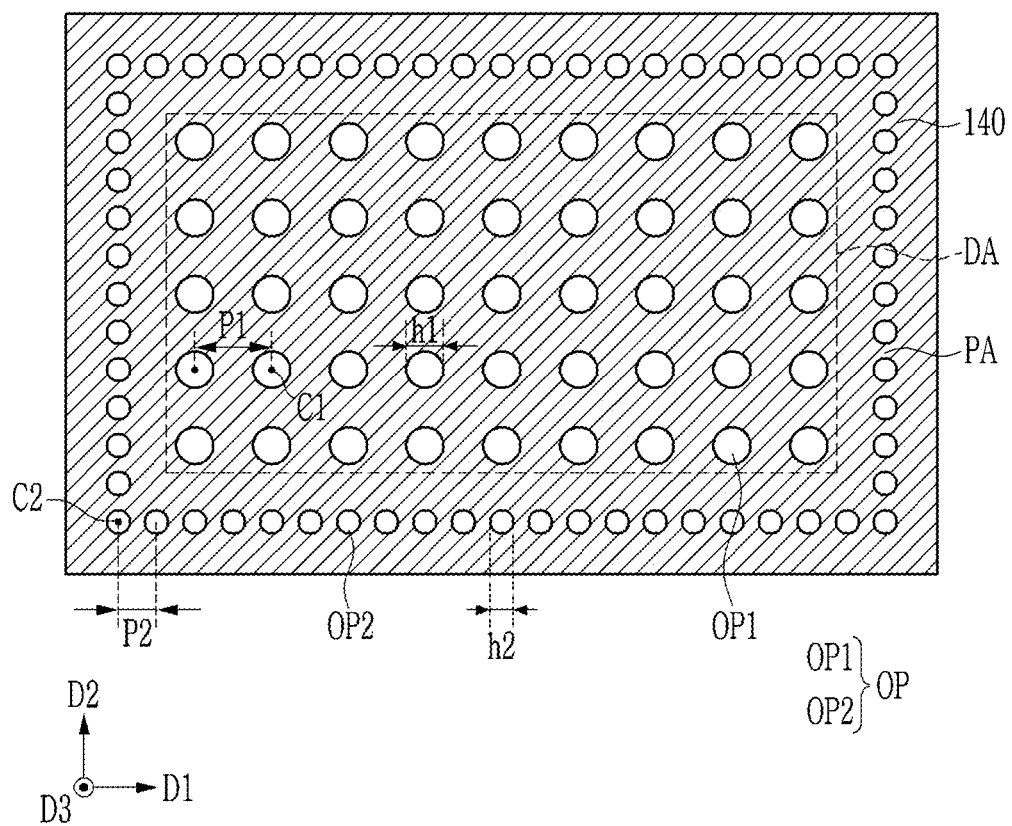

Referring to FIG. 7, the inorganic layer 140 may overlap the display area DA and the peripheral area PA.

The inorganic layer 140 may include a plurality of openings OP. The plurality of openings OP included in the inorganic layer 140 may overlap not only the display area DA but also the peripheral area PA. The area of the plane occupied by the plurality of openings OP may be about 60% to about 70% of the sum of the areas of the display area DA and the peripheral area PA.

The opening OP may include a first opening OP1 overlapping the display area DA and a second opening OP2 overlapping the peripheral area PA. Although not shown, at least one of the first opening OP1 and the second opening OP2 may be disposed at a boundary between the display area DA and the peripheral area PA.

In this exemplary embodiment, a distance between respective centers C1 of two adjacent first openings OP1 disposed in the display area DA is the first pitch P1. A distance between respective centers C2 of two adjacent second openings OP2 disposed in the peripheral area PA is the second pitch P2.

In some exemplary embodiments, the first pitch P1 and the second pitch P2 may be different. The distance between the centers C1 of the first openings OP1 and the distance of the centers C2 of the second openings OP2 may be different.

In some exemplary embodiments, the first pitch P1 may be smaller than the second pitch P2. The straight-line distance between the centers C1 of the plurality of first openings OP1 overlapping the display area DA may be greater than that between the centers C2 of the plurality of second openings OP2 overlapping the peripheral area PA.

Each of the first pitch P1 and the second pitch P2 may be about 5 μm to about 10 μm. When the first pitch P1 and the second pitch P2 are less than about 5 μm or greater than about 10 μm, the light passing through the inorganic layer 140 may not be effectively diffracted, scattered, or refracted. While the first pitch P1 and the second pitch P2 may satisfy the above-mentioned numerical range, the second pitch P2 may be smaller than the first pitch P1.

The diameter h1 of the first opening OP1 may be greater than the diameter h2 of the second opening OP2. As shown in FIG. 7, the planar size of the first opening OP1 overlapping the display area DA may be larger than the planar size of the second opening OP2 overlapping the peripheral area PA. The planar size of the second opening OP2 may be smaller than that of the first opening OP1.

The diameter h1 of the first opening OP1 may be about 55% to about 85% of the first pitch P1. The diameter h2 of the second opening OP2 may be about 55% to about 85% of the second pitch P2.

According to this exemplary embodiment, each of the first opening OP1 and the second opening OP2 has a diameter corresponding to about 55% to 85% of each of the first pitch P1 and the second pitch P2, and the diameter of the first opening OP1 may be greater than the diameter of the second opening OP2.

Figure 8:
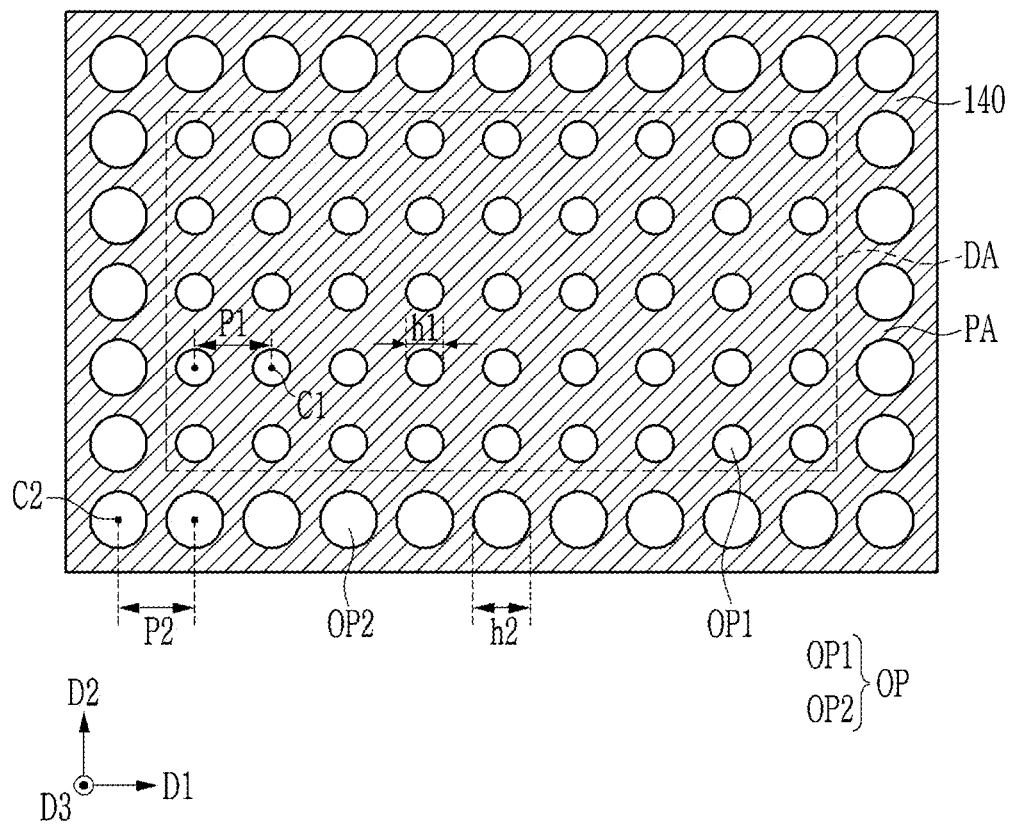

Referring to FIG. 8, the inorganic layer 140 may overlap the display area DA and the peripheral area PA.

The inorganic layer 140 may include a plurality of openings OP. The plurality of openings OP included in the inorganic layer 140 may overlap not only the display area DA but also the peripheral area PA. The area of the plane occupied by the plurality of openings OP may be about 60% to about 70% of the sum of the areas of the display area DA and the peripheral area PA.

The opening OP may include a first opening OP1 overlapping the display area DA and a second opening OP2 overlapping the peripheral area PA. Although not shown, at least one of the first opening OP1 and the second opening OP2 may be disposed at a boundary between the display area DA and the peripheral area PA.

In the exemplary embodiment shown in FIG. 8, a distance between respective centers C1 of two adjacent first openings OP1 disposed in the display area DA is the first pitch P1. A distance between respective centers C2 of two adjacent second openings OP2 disposed in the peripheral area PA is the second pitch P2.

The first pitch P1 and the second pitch P2 according to an exemplary embodiment may be substantially the same. The straight-line distance between the centers of the plurality of first openings OP1 overlapping the display area DA may be substantially the same as that between the centers of the plurality of second openings OP2 overlapping the peripheral area PA. Intervals between centers of the plurality of openings OP1 and OP2 may be substantially the same in all of the display area DA and the peripheral area PA.

Each of the first pitch P1 and the second pitch P2 may be about 5 μm to about 10 μm. When the first pitch P1 and the second pitch P2 are less than about 5 μm or greater than about 10 μm, the light passing through the inorganic layer 140 may not be effectively diffracted, scattered, or refracted.

The diameter h1 of the first opening OP1 may be less than the diameter h2 of the second opening OP2. As shown in FIG. 8, the planar size of the first opening OP1 overlapping the display area DA may be smaller than the planar size of the second opening OP2 overlapping the peripheral area PA. The planar size of the second opening OP2 may be larger than that of the first opening OP1.

The diameter h1 of the first opening OP1 may be about 55% to about 85% of the first pitch P1. The diameter h2 of the second opening OP2 may be about 55% to about 85% of the second pitch P2.

According to this exemplary embodiment, each of the first opening OP1 and the second opening OP2 has a diameter corresponding to about 55% to 85% of each of the first pitch P1 and the second pitch P2, and the diameter h1 of the first opening OP1 may be less than the diameter h2 of the second opening OP2.

Figure 9:
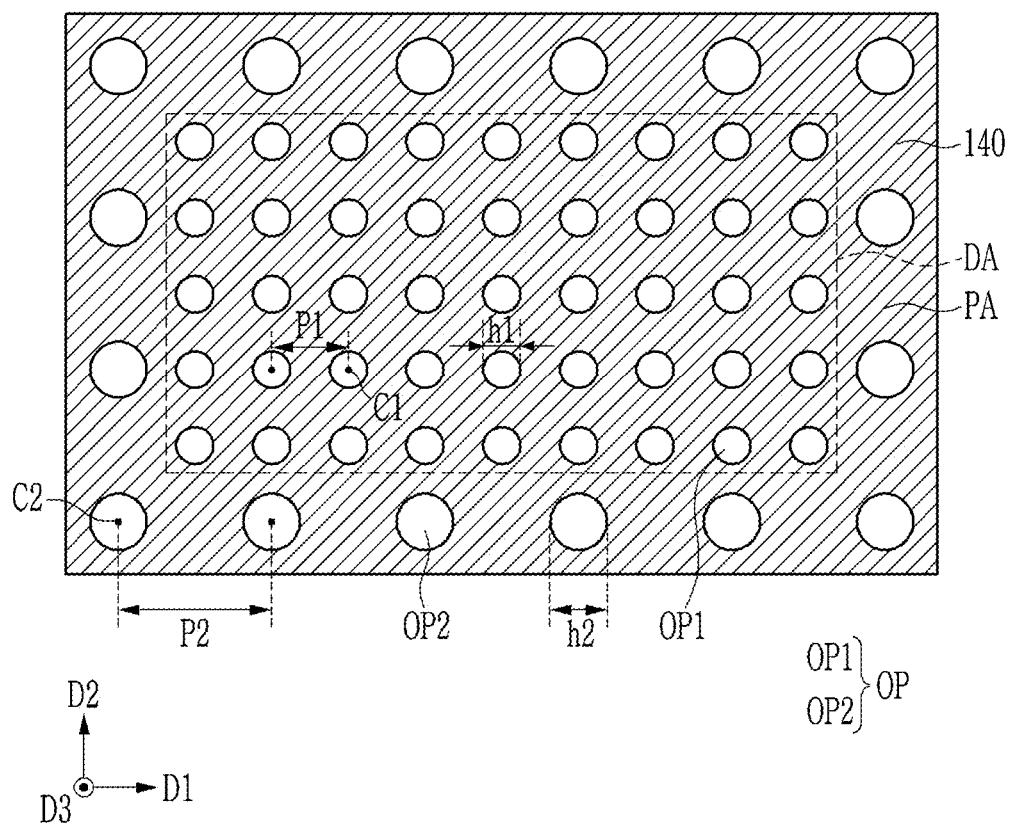

Referring to FIG. 9, the inorganic layer 140 may overlap the display area DA and the peripheral area PA.

The inorganic layer 140 may include a plurality of openings OP. The plurality of openings OP included in the inorganic layer 140 may overlap not only the display area DA but also the peripheral area PA. The area of the plane occupied by the plurality of openings OP may be about 60% to about 70% of the sum of the areas of the display area DA and the peripheral area PA.

The opening OP may include a first opening OP1 overlapping the display area DA and a second opening OP2 overlapping the peripheral area PA. Although not shown, at least one of the first opening OP1 and the second opening OP2 may be disposed at a boundary between the display area DA and the peripheral area PA.

In the exemplary embodiment shown in FIG. 9, a distance between respective centers C1 of two adjacent first openings OP1 disposed in the display area DA is the first pitch P1. A distance between respective centers C2 of two adjacent second openings OP2 disposed in the peripheral area PA is the second pitch P2.

In some embodiments, the first pitch P1 and the second pitch P2 may be different. The distance between the first openings OP1 and the distance between the second openings OP2 may be different.

In some exemplary embodiments, the first pitch P1 may be smaller than the second pitch P2. The straight-line distance between the centers C1 of the plurality of first openings OP1 overlapping the display area DA may be less than that between the centers C2 of the plurality of second openings OP2 overlapping the peripheral area PA.

Each of the first pitch P1 and the second pitch P2 may be about 5 μm to about 10 μm. When the first pitch P1 and the second pitch P2 are less than about 5 μm or greater than about 10 μm the light passing through the inorganic layer 140 may not be effectively diffracted, scattered, or refracted. While the first pitch P1 and the second pitch P2 may satisfy the above-mentioned numerical range, the second pitch P2 may be larger than the first pitch P1.

The diameter h1 of the first opening OP1 may be less than the diameter h2 of the second opening OP2. As shown in FIG. 9, the planar size of the first opening OP1 overlapping the display area DA may be smaller than the planar size of the second opening OP2 overlapping the peripheral area PA. The planar size of the second opening OP2 may be larger than that of the first opening OP1.

The diameter h1 of the first opening OP1 may be about 55% to about 85% of the first pitch P1. The diameter h2 of the second opening OP2 may be about 55% to about 85% of the second pitch P2.

According to this exemplary embodiment, each of the first opening OP1 and the second opening OP2 has a diameter corresponding to about 55% to 85% of each of the first pitch P1 and the second pitch P2, and the diameter h1 of the first opening OP1 may be less than the diameter h2 of the second opening OP2.

Figure 10:
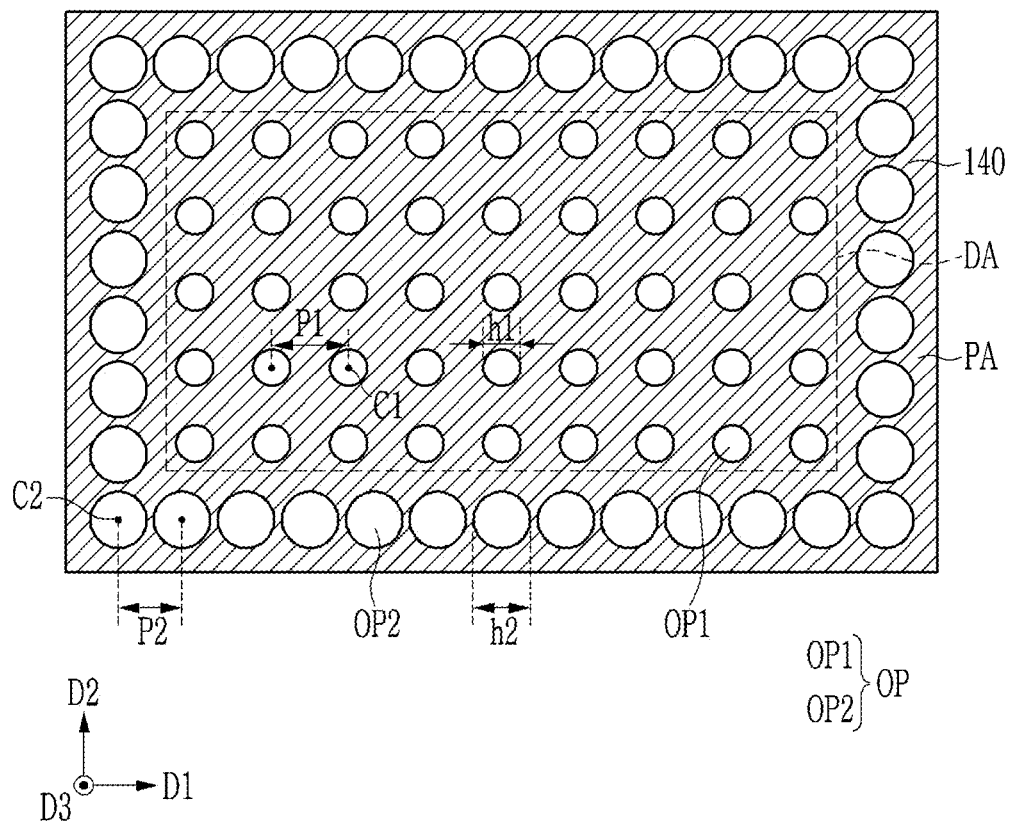

Referring to FIG. 10, the inorganic layer 140 may overlap the display area DA and the peripheral area PA.

The inorganic layer 140 may include a plurality of openings OP. The plurality of openings OP included in the inorganic layer 140 may overlap not only the display area DA but also the peripheral area PA. The area of the plane occupied by the plurality of openings OP may be about 60% to about 70% of the sum of the areas of the display area DA and the peripheral area PA.

The opening OP may include a first opening OP1 overlapping the display area DA and a second opening OP2 overlapping the peripheral area PA. Although not shown, at least one of the first opening OP1 and the second opening OP2 may be disposed at a boundary between the display area DA and the peripheral area PA.

In this exemplary embodiment, a distance between respective centers C1 of two adjacent first openings OP1 disposed in the display area DA is the first pitch P1. A distance between respective centers C2 of two adjacent second openings OP2 disposed in the peripheral area PA is the second pitch P2.

In some exemplary embodiments, the first pitch P1 and the second pitch P2 may be different. The distance between the centers C1 of the first openings OP1 and the distance of the centers C2 of the second openings OP2 may be different.

In some exemplary embodiments, the first pitch P1 may be smaller than the second pitch P2. The straight-line distance between the centers of the plurality of first openings OP1 overlapping the display area DA may be greater than that between the centers of the plurality of second openings OP2 overlapping the peripheral area PA.

Each of the first pitch P1 and the second pitch P2 may be about 5 μm to about 10 μm. When the first pitch P1 and the second pitch P2 are less than about 5 μm or greater than about 10 μm, the light passing through the inorganic layer 140 may not be effectively diffracted, scattered, or refracted. While the first pitch P1 and the second pitch P2 may satisfy the above-mentioned numerical range, the second pitch P2 may be smaller than the first pitch P1.

The diameter h1 of the first opening OP1 may be less than the diameter h2 of the second opening OP2. As shown in FIG. 10, the planar size of the first opening OP1 overlapping the display area DA may be smaller than the planar size of the second opening OP2 overlapping the peripheral area PA. The planar size of the second opening OP2 may be larger than that of the first opening OP1.

The diameter h1 of the first opening OP1 may be about 55% to about 85% of the first pitch P1. The diameter h2 of the second opening OP2 may be about 55% to about 85% of the second pitch P2.

According to this exemplary embodiment, each of the first opening OP1 and the second opening OP2 has a diameter corresponding to about 55% to 85% of each of the first pitch P1 and the second pitch P2, and the diameter h1 of the first opening OP1 may be less than the diameter h2 of the second opening OP2.

Figure 11:
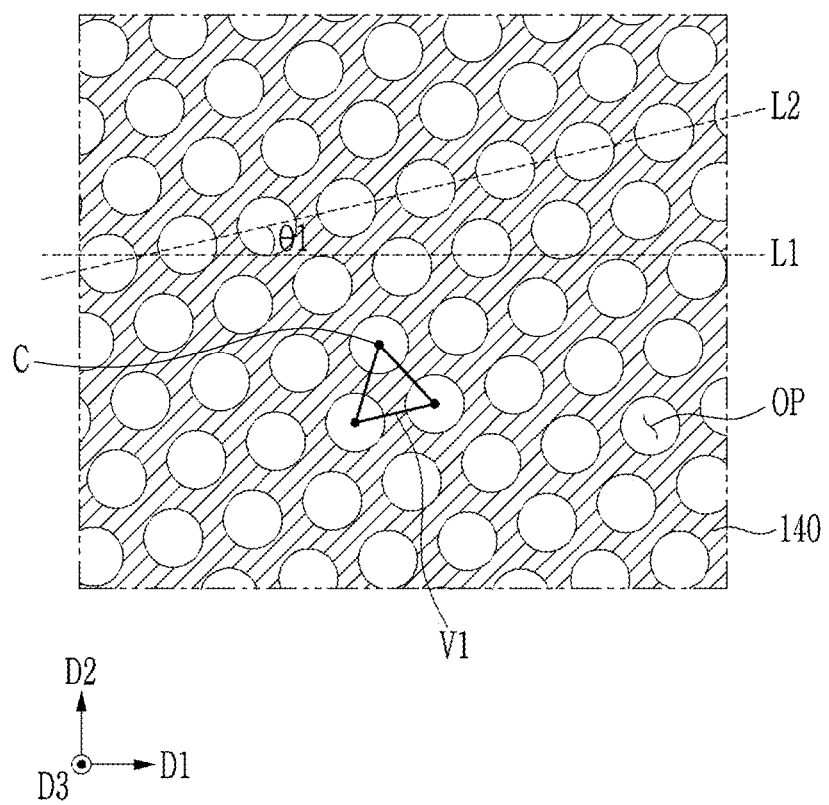

Referring to FIG. 11, the inorganic layer 140 may include the plurality of openings OP.

In this case, by connecting the centers C of three adjacent openings OP, a virtual triangle V1 may be formed. In this case, the virtual triangle V1 may be, for example, an equilateral triangle or an isosceles triangle, but the inventive concept is not limited thereto.

According to this exemplary embodiment, an imaginary second line L2 passing the centers of the plurality of openings OP with respect to an imaginary first line L1 parallel to a direction D1 may be inclined. A first angle θ1 between the first line L1 and the second line L2 may be between about 3 degrees and about 30 degrees.

In this case, the imaginary second line L2 may be a line inclined at the smallest angle with the imaginary first line L1 among a plurality of imaginary lines passing the centers of the plurality of openings OP. The imaginary first line L1 may be parallel to the direction D1, and may be a line substantially parallel to an edge of the first substrate.

Figure 12:
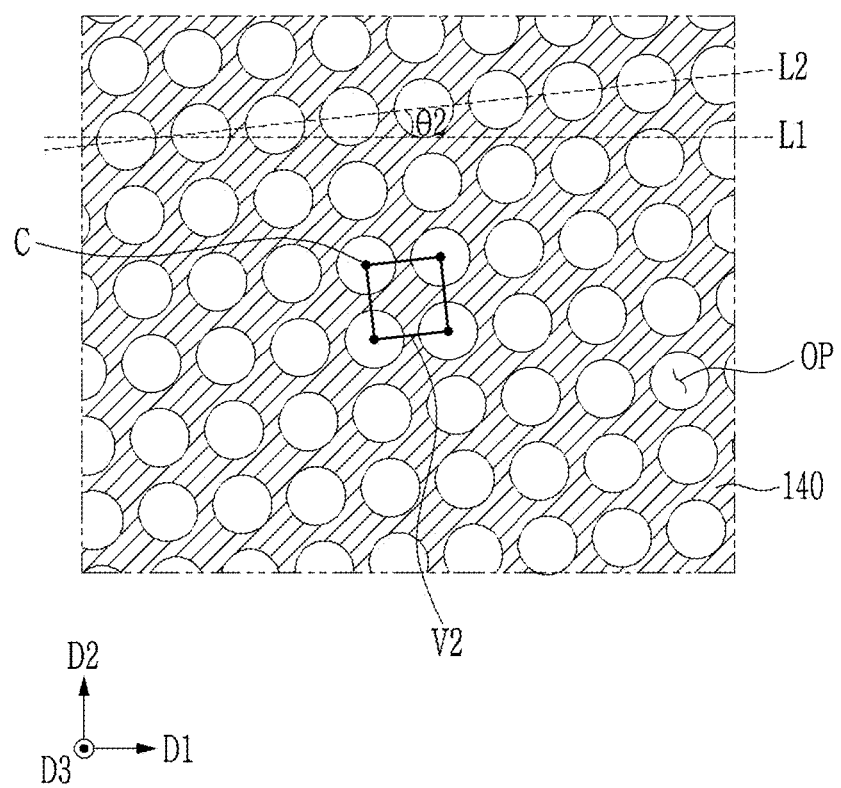

Referring to FIG. 12, the inorganic layer 140 may include the plurality of openings OP. In this case, by connecting the centers C of four adjacent openings OP, a virtual quadrangle V2 may be formed. The virtual quadrangle V2 may have four corners at 90 degrees, and may be, for example, square or rectangular, but the inventive concept is not limited thereto.

In this exemplary embodiment, an imaginary second line L2 passing the centers of the plurality of openings OP with respect to an imaginary first line L1 parallel to a direction D1 may be inclined. A second angle θ2 between the first line L1 and the second line L2 may be between about 3 degrees and about 30 degrees.

In this case, the imaginary second line L2 may be a line inclined at the smallest angle with the imaginary first line L1 among a plurality of imaginary lines passing the centers of the plurality of openings OP. The imaginary first line L1 may be parallel to the direction D1. For example, the imaginary first line L1 may be substantially parallel to one edge of the substrate.

Figure 13:
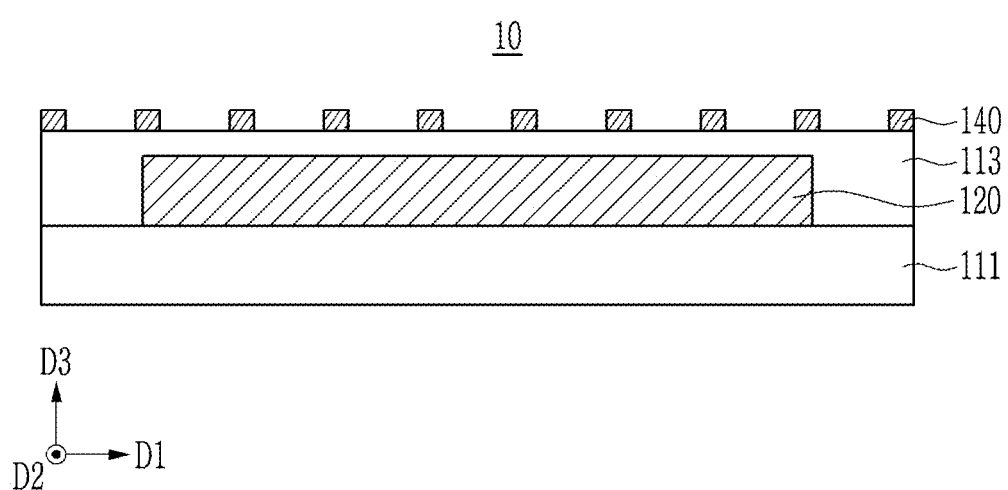
FIG. 13 illustrates a schematic cross-sectional view of a display panel according to an exemplary embodiment.
Figure 14:
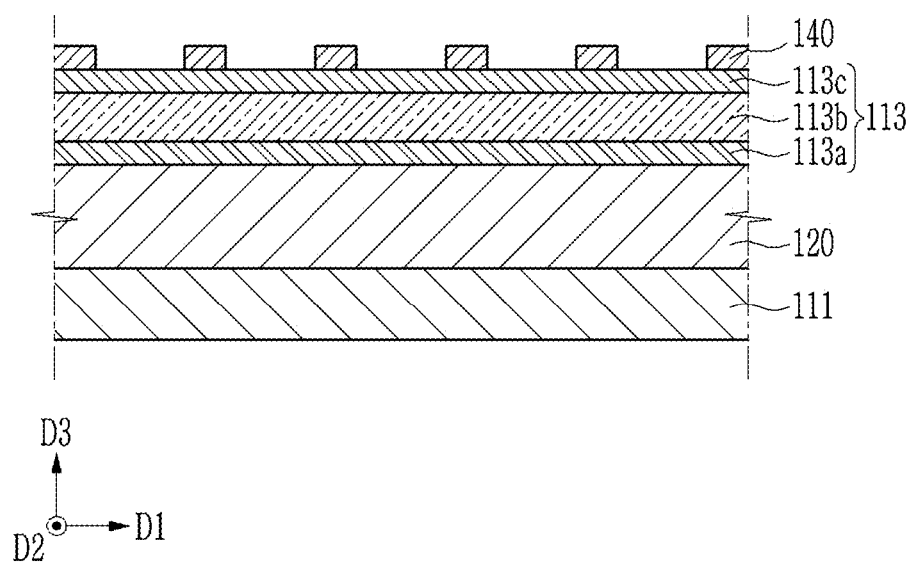
FIG. 14 illustrates a specific cross-sectional view of the display panel according to the exemplary embodiment of FIG. 13.
Figure 15:
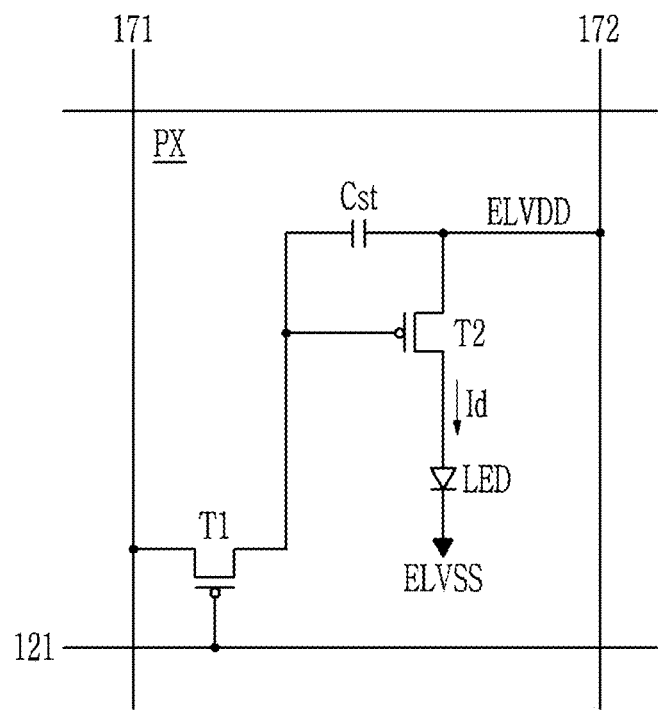
FIG. 15 illustrates a circuit diagram of one pixel included in a display part according to an exemplary embodiment.

Hereinafter, a display panel according to an exemplary embodiment will be described with reference to FIG. 13 to FIG. 15. FIG. 13 illustrates a schematic cross-sectional view of a display panel according to an exemplary embodiment. FIG. 14 illustrates a specific cross-sectional view of the display panel according to the embodiment of FIG. 13. FIG. 15 illustrates a circuit diagram of one pixel included in a display panel according to an exemplary embodiment.

Referring to FIG. 13, the display panel 10 according to an exemplary embodiment includes the first substrate 111, the display part 120 disposed on the first substrate 111, an encapsulation layer 113 covering the display part 120, and the inorganic layer 140 disposed on the encapsulation layer 113. In some exemplary embodiments, the display panel 10 may be a flat display panel, or a flexible display panel capable of being bent, folded, or rolled.

The first substrate 111 according to this exemplary embodiment includes the display area DA overlapping the plurality of pixels and the peripheral area PA surrounding the display area DA. The peripheral area PA may overlap an edge of the first substrate 111, and is disposed outside the display area DA.

The first substrate 111 may be an insulating substrate including glass, quartz, ceramics, plastic, or the like, or a metallic substrate including stainless steel or the like. In some exemplary embodiments, the first substrate 111 may be flat or flexible.

The display part 120 may include a plurality of pixels. One pixel may include a thin film transistor and a light emitting diode connected to the thin film transistor. The thin film transistor and the light emitting diode connected thereto will be described later with reference to FIG. 15. The display part 120 is not limited to this exemplary embodiment including the thin film transistor and the light emitting diode, but may include a thin film transistor and a liquid crystal layer.

The encapsulation layer 113 may include an organic film and an inorganic layer that are alternately stacked. For example, the encapsulation layer 113 may have a stacked structure in which the first organic film is disposed between the first inorganic layer and the second inorganic layer, but is not limited thereto. The encapsulation layer 113 may prevent oxygen or moisture from penetrating into the display part 120. Since the inorganic layer 140 is the same as that described above, a detailed description thereof will be omitted.

Referring to FIG. 14, the encapsulation layer 113 according to an exemplary embodiment will be described in more detail.

The encapsulation layer 113 may include a structure in which one or more inorganic layers and one or more organic films are stacked. In some exemplary embodiments, the encapsulation layer 113 may include a first encapsulation inorganic layer 113a, an encapsulation organic film 113b, and a second encapsulation inorganic layer 113c. In the encapsulation layer 113, the first encapsulation inorganic layer 113a and the second encapsulation inorganic layer 113c may mainly prevent penetration of moisture and the like, and the encapsulation organic film 113b may mainly flatten a surface of the encapsulation layer 113.

The first encapsulation inorganic layer 113a and the second encapsulation inorganic layer 113c may contain an inorganic insulating material, such as a silicon oxide, a silicon nitride, or the like. The encapsulation organic film 113b may include organic materials, such as an acrylic resin, a methacrylic resin, a polyisoprene, a vinyl-based resin, an epoxy-based resin, a urethane-based resin, a cellulose-based resin, or a perylene-based resin.

In some exemplary embodiments, the inorganic layer 140 may be disposed on the encapsulation layer 113. For example, the inorganic layer 140 may be disposed on the second encapsulation inorganic layer 113c of the encapsulation layer 113, but the inventive concept is not limited thereto, and may be disposed on an organic film when the uppermost layer of the encapsulation layer 113 is an organic film.

Hereinafter, one pixel included in the display panel will be described with reference to FIG. 15.

As shown in FIG. 15, one pixel PX included in the display panel according to an exemplary embodiment includes signal lines 121, 171, and 172; transistors T1 and T2 connected to the signal lines 121, 171, and 172; a storage capacitor Cst; and a light emitting diode LED.

The transistors T1 and T2 may include a switching transistor T1 and a driving transistor T2.

The signal lines 121, 171, and 172 include a scan line 121 for transmitting a scan signal Sn, a data line 171 crossing the scan line 121 and for transmitting a data signal Dm, and a driving voltage line 172 for transmitting a driving voltage ELVDD and being substantially parallel to the data line 171.

The switching transistor T1 has a control terminal, an input terminal, and an output terminal. The control terminal is connected to the scan line 121, the input terminal is connected to the data line 171, and the output terminal is connected to the driving transistor T2. The switching transistor T1 transmits the data signal Dm applied to the data line 171 to the driving transistor T2 in response to the scan signal Sn applied to the scan line 121.

The driving transistor T2 also has a control terminal, an input terminal, and an output terminal. The control terminal is connected to the switching transistor T1, the input terminal is connected to the driving voltage line 172, and the output terminal is connected to the light emitting diode LED. The driving transistor T2 transmits a driving current Id of which magnitude varies according to a voltage applied between the control terminal and the output terminal.

The storage capacitor Cst is connected between the control terminal and the input terminal of the driving transistor T2. The storage capacitor Cst charges the data signal applied to the control terminal of the driving transistor T2, and maintains the data signal even after the switching transistor T1 is turned off.

The light emitting diode LED includes an anode connected to the output terminal of the driving transistor T2 and a cathode connected to the common voltage ELVSS. The light emitting diode LED displays an image by emitting light with variable intensity according to the driving current Id of the driving transistor T2.

The switching transistor T1 and the driving transistor T2 may be n-channel or p-channel electric field effect transistors (FET).

In the present specification, although the structure of one pixel including two transistors and one capacitor is shown, the inventive concept is not limited thereto, and the number of transistors and the number of capacitors may be variously changed.

In the present specification, although various exemplary embodiments have been described, the inventive concept may include exemplary embodiments in which the various exemplary embodiments are combined with each other.

Figure 16:
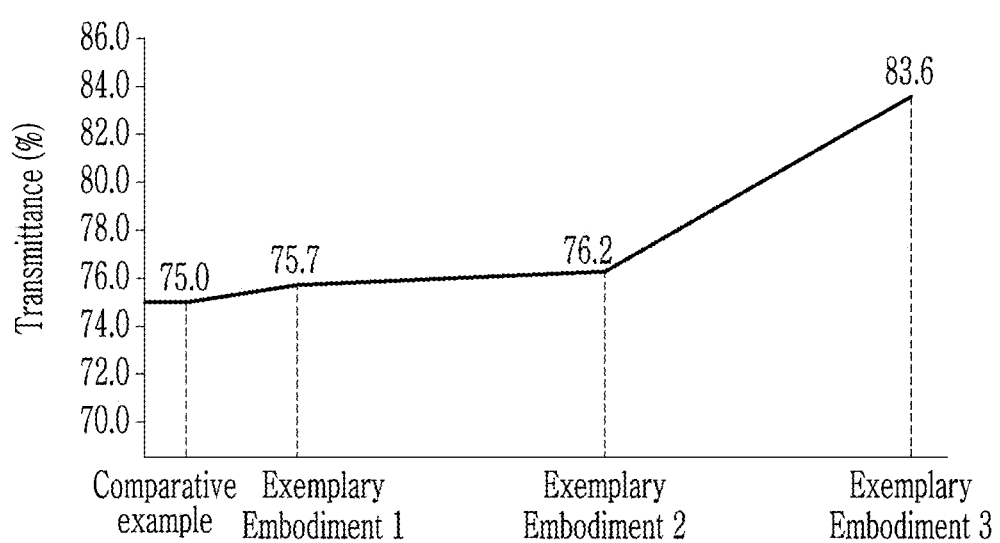
FIG. 16 illustrates a graph of transmittance of a display panel according to an exemplary embodiment.

Hereinafter, a display device according to an exemplary embodiment will be described with reference to FIG. 16 to FIG. 18. FIG. 16 illustrates a graph of transmittance of a display panel according to an exemplary embodiment, and FIGS. 17 and 18 illustrate images of a display area viewed by a user, respectively.

In FIG. 16, a comparative example is a display panel having an inorganic layer including openings overlapping a display area, and Exemplary Embodiments 1 to 3 are display-panels having an inorganic layer including openings overlapping a display area and a peripheral area. In Exemplary Embodiments 1 to 3, pitches between the openings overlapping the display areas and the peripheral area are substantially the same, a diameter of an opening of Exemplary Embodiment 2 is greater than that of Exemplary Embodiment 1, and a diameter of an opening of Exemplary Embodiment 3 is greater than those of Exemplary Embodiments 1 and 2. In addition, uniformity of sizes of and intervals between the openings increases in order of Exemplary Embodiments 1, 2, and 3 with respect to 100 openings.

The transmittance of the comparative example was about 75%, and the transmittance of Exemplary Embodiment 1, which includes the inorganic layer disposed in the peripheral area, was increased to about 75.7%, compared with the comparative example. In addition, in Exemplary Embodiments 2 and 3, it was confirmed that the transmittance increased to about 76.2% and about 83.6% when the uniformity of the openings was increased while adjusting the size of the openings or the pitch between the openings.

Figure 17:
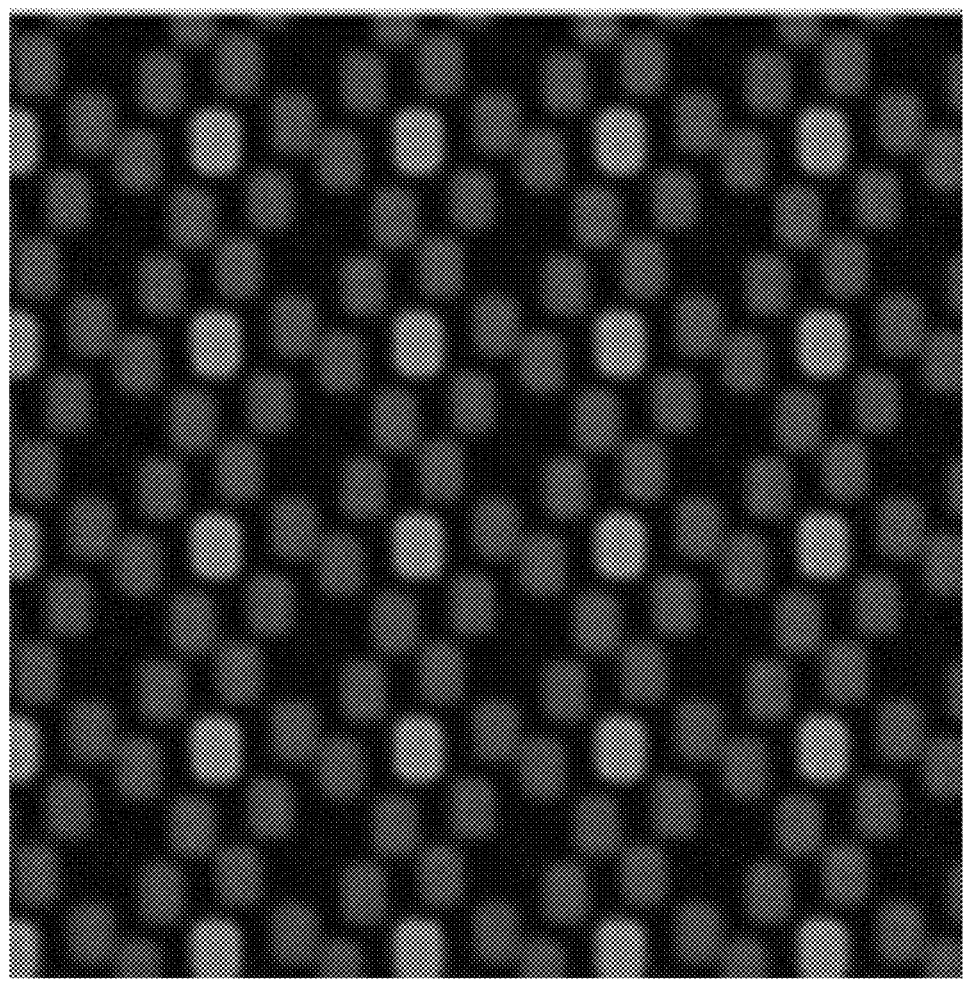
FIGS. 17 and 18 illustrate an image of a display area to be viewed by a user.
Figure 18:
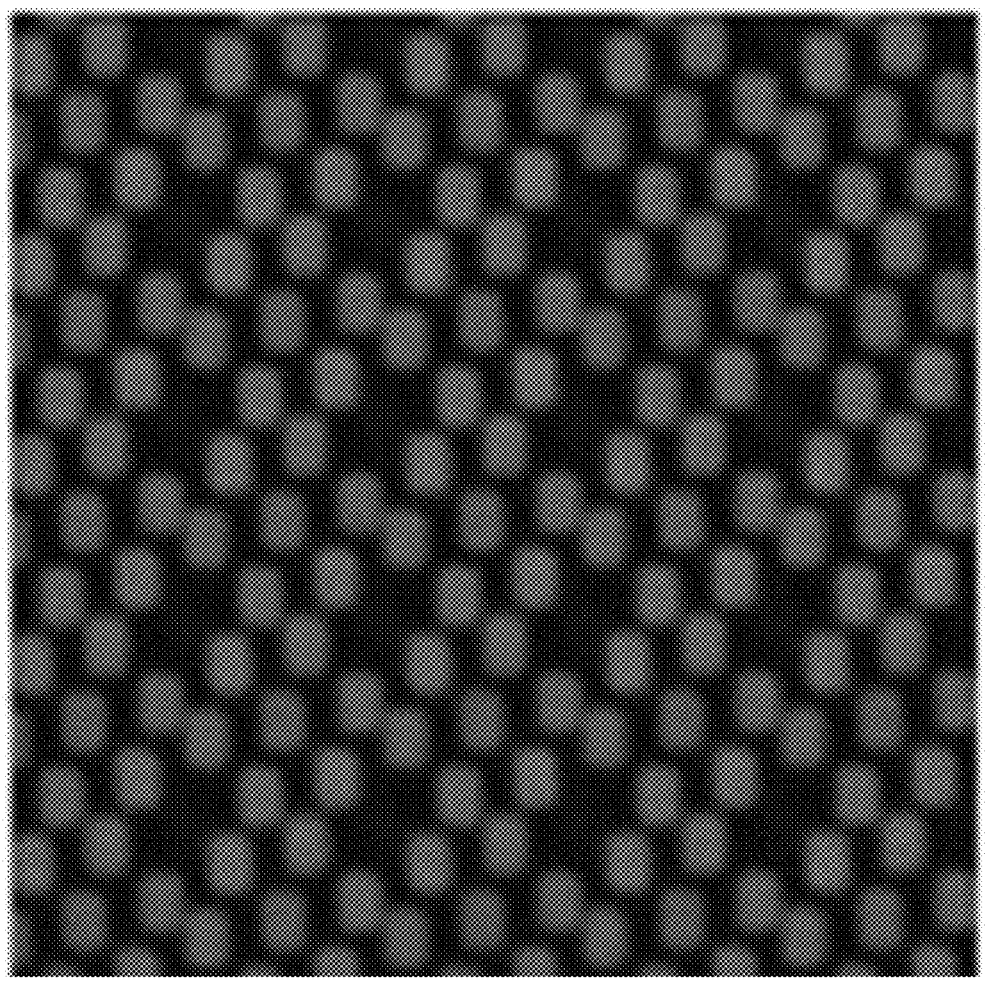

FIG. 17 illustrates an image of a portion of the pixel area passing through the display panel including the inorganic layer according to Exemplary Embodiment 1, and FIG. 18 illustrates an image of a portion of the pixel area passing through the display panel including the inorganic layer according to Exemplary Embodiment 3.

In the case of the inorganic layer including the plurality of openings having a uniform shape and a uniform pitch, it is confirmed that the transmittance of the display panel is increased as shown in FIG. 16, and a plurality of virtual pixels may be viewed by a light diffraction phenomenon due to the inorganic layer as shown in FIG. 17 and FIG. 18, and the display quality may be improved.

Process performance of the comparative example and the exemplary embodiments will be discussed with reference to Table 1. The comparative example is a case in which the inorganic layer includes the openings overlapping the display area, and Exemplary Embodiments 1 to 4 are cases in which the inorganic layer includes the openings overlapping the display area and the peripheral area. In this case, in Exemplary Embodiment 1, the diameter of the opening overlapping the peripheral area is less than that of the opening overlapping the display area, and the pitch between the openings overlapping the peripheral area is equal to that between the openings overlapping the display area. In Exemplary Embodiment 2, the plurality of openings overlapping the display area and the peripheral area have the same size and the same pitch. In Exemplary Embodiment 3, the diameter of the opening overlapping the peripheral area is less than that of the opening overlapping the display area, and the pitch between the openings overlapping the peripheral area is larger than that between the openings overlapping the display area. In Exemplary Embodiment 4, the diameter of the opening overlapping the peripheral area is greater than that of the opening overlapping the display area, and the pitch between the openings overlapping the peripheral area is larger than that between the openings overlapping the display area.

Table 1 shows the pitches and diameters of the openings overlapping the peripheral area with respect to the openings overlapping the display area.

Based on Ppk for evaluating process capability, the comparative example showed about 0.32, but Exemplary Embodiment 1 showed about 6.53, Exemplary Embodiment 2 showed about 6.73, Exemplary Embodiment 3 showed about 5.39, and Exemplary Embodiment 4 showed about 2.26. The larger the Ppk value, the better the process capability and the lower the defect rate.

According to Exemplary Embodiments 1 to 4, when the openings are disposed in the display area and the peripheral area, it is confirmed that the process capability is significantly improved and the defect rate is also reduced.

TABLE 1

|  | Pitch between openings | Opening diameter | Process capability (Ppk) |
|---|---|---|---|
| Comparative Example | — | — | 0.32 |
| Exemplary Embodiment 1 | Same | Decrease | 6.53 |
| Exemplary Embodiment 2 | Same | Same | 6.73 |
| Exemplary Embodiment 3 | Increase | Decrease | 5.39 |
| Exemplary Embodiment 4 | Increase | Increase | 2.26 |

In summary, the openings of the inorganic layer according to this exemplary embodiment may be disposed in both the display area and the peripheral area. According to the manufacturing process for forming such openings, the plurality of openings may be formed to have a uniform shape and a uniform pitch. This makes it possible to provide a display device having excellent display quality and improved transmittance.

According to the inventive concepts, transmittance and display quality of a display device may be improved.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a first substrate including a display area and a peripheral area;
   a display part disposed on the first substrate and comprising a plurality of pixels;
   a second substrate disposed on the display part; and
   an inorganic layer disposed on the second substrate,
   wherein the inorganic layer includes an opening, and the opening overlaps the display area and the peripheral area.

2. The display device of claim 1, wherein the opening includes:
   a first opening overlapping the display area; and
   a second opening overlapping the peripheral area.

3. The display device of claim 2, wherein a diameter of the first opening is substantially the same as that of the second opening.

4. The display device of claim 2, wherein a diameter of the first opening is greater than that of the second opening.

5. The display device of claim 2, wherein a diameter of the first opening is less than that of the second opening.

6. The display device of claim 2, wherein:
   a distance between centers of a plurality of adjacent first openings is a first pitch; and
   a distance between centers of a plurality of adjacent second openings is a second pitch.

7. The display device of claim 6, wherein the first pitch is substantially the same as the second pitch.

8. The display device of claim 6, wherein the first pitch is larger than the second pitch.

9. The display device of claim 6, wherein the first pitch is smaller than the second pitch.

10. The display device of claim 1, wherein a virtual triangle is formed by connecting centers of three adjacent openings.

11. The display device of claim 10, wherein the virtual triangle is an equilateral triangle.

12. The display device of claim 1, wherein a virtual quadrangle is formed by connecting centers of four adjacent openings.

13. The display device of claim 12, wherein the virtual quadrangle is a square.

14. The display device of claim 1, wherein an imaginary second line crossing the centers of the plurality of openings is inclined with respect to an imaginary first line substantially parallel to one edge of the first substrate.

15. The display device of claim 14, wherein an angle between the imaginary first line and the imaginary second line is about 3 degrees to about 30 degrees.

16. A display device comprising:
   a housing;
   a display panel mounted on the housing; and
   an optical part overlapping the display panel,
   wherein:
   the display panel comprises:
   a first substrate including a display area and a peripheral area;

a display part disposed on the first substrate and comprising a plurality of pixels; and
an inorganic layer disposed on the display part; and
the inorganic layer includes a plurality of openings overlapping the display area and the peripheral area, and the peripheral area overlaps an edge of the first substrate.

17. The display device of claim 16, further comprising a second substrate or an encapsulation layer disposed between the display part and the inorganic layer.

18. The display device of claim 16, wherein the plurality of opening includes:
a first opening overlapping the display area; and
a second opening overlapping the peripheral area.

19. The display device of claim 18, wherein a planar size of the first opening is substantially the same as that of the second opening.

20. The display device of claim 16, wherein a diameter of one opening is 55% to 85% of a distance between centers of two adjacent openings.

21. The display device of claim 17, wherein the encapsulation layer comprises:
a first encapsulation inorganic layer;
a second encapsulation inorganic layer overlapping the first encapsulation inorganic layer; and
an encapsulation organic film disposed between the first encapsulation inorganic layer and the second encapsulation inorganic layer.

22. The display device of claim 21, wherein the inorganic layer is disposed on the second encapsulation inorganic layer.

* * * * *